(12) United States Patent
Donoso et al.

(10) Patent No.: US 10,364,497 B2
(45) Date of Patent: Jul. 30, 2019

(54) VAPOR BASED SITE-ISOLATED PROCESSING SYSTEMS AND METHODS

(71) Applicant: Intermolecular, Inc., San Jose, CA (US)

(72) Inventors: Bernardo Donoso, San Jose, CA (US); Karl Littau, Palo Alto, CA (US); Lawrence D. Bartholomew, Felton, CA (US)

(73) Assignee: INTERMOLECULAR, INC., San Jose, CA (US)

( * ) Notice: Subject to any disclaimer, the term of this patent is extended or adjusted under 35 U.S.C. 154(b) by 11 days.

(21) Appl. No.: 15/427,882

(22) Filed: Feb. 8, 2017

(65) Prior Publication Data

US 2017/0233868 A1    Aug. 17, 2017

Related U.S. Application Data

(60) Provisional application No. 62/293,897, filed on Feb. 11, 2016.

(51) Int. Cl.
*C23C 16/455* (2006.01)
*C23C 16/44* (2006.01)

(52) U.S. Cl.
CPC .... *C23C 16/45565* (2013.01); *C23C 16/4412* (2013.01); *C23C 16/45544* (2013.01); *C23C 16/45574* (2013.01)

(58) Field of Classification Search
CPC ........ C23C 16/45565; C23C 16/45544; C23C 16/4412; C23C 16/45574; C23C 16/52; C23C 16/45517; C23C 16/45587; C23C 16/45514; C23C 16/04; C23C 16/45519; C23C 16/455; H01J 37/3244; H01J 37/32449; H01J 37/32366
See application file for complete search history.

(56) References Cited

U.S. PATENT DOCUMENTS

| | | | | |
|---|---|---|---|---|
| 6,090,210 A | * | 7/2000 | Ballance | C23C 16/45565 118/50.1 |
| 8,900,364 B2 | * | 12/2014 | Wright | C23C 16/45565 118/715 |
| 9,175,391 B2 | * | 11/2015 | Endo | C23C 16/45565 |
| 9,175,392 B2 | * | 11/2015 | Satitpunwaycha | C23C 16/45565 |
| 2010/0221426 A1 | * | 9/2010 | Sferlazzo | C23C 16/45551 427/255.26 |

(Continued)

*Primary Examiner* — Savitri Mulpuri
(74) *Attorney, Agent, or Firm* — Hunter Clark PLLC (57) ABSTRACT

Embodiments provided herein describe systems and method for processing substrates. A substrate is provided. A showerhead is positioned above the substrate. The showerhead includes a plurality of injection ports, at least one isolation channel, and at least one exhaust port on a bottom surface thereof. The at least one isolation channel separates the plurality of injection ports into two or more sections. The at least one exhaust port is positioned within the at least one isolation channel. The plurality of injection ports are not in fluid communication with the at least one exhaust port within the showerhead. At least one processing fluid is caused to be delivered from the plurality of injection ports onto the substrate. At least some of the at least one processing fluid is caused to be removed from the substrate through the at least one exhaust port.

11 Claims, 10 Drawing Sheets

(56) References Cited

U.S. PATENT DOCUMENTS

| | | | | |
|---|---|---|---|---|
| 2012/0225207 A1* | 9/2012 | Yudovsky | .......... | C23C 16/45551 |
| | | | | 427/255.5 |
| 2013/0130490 A1* | 5/2013 | Lee | .......... | C23C 16/04 |
| | | | | 438/597 |
| 2013/0316472 A1* | 11/2013 | Joshi | .......... | G01N 27/002 |
| | | | | 438/17 |
| 2014/0037847 A1* | 2/2014 | Vermeer | .......... | C23C 16/45551 |
| | | | | 427/255.28 |
| 2014/0044887 A1* | 2/2014 | Vermeer | .......... | C23C 16/4401 |
| | | | | 427/535 |
| 2014/0110764 A1* | 4/2014 | Niyogi | .......... | C23C 14/04 |
| | | | | 257/288 |
| 2014/0154859 A1* | 6/2014 | Gopal | .......... | H01L 22/34 |
| | | | | 438/382 |
| 2014/0162384 A1* | 6/2014 | Joshi | .......... | H01L 22/14 |
| | | | | 438/17 |
| 2014/0179033 A1* | 6/2014 | Mathur | .......... | H01L 22/14 |
| | | | | 438/17 |
| 2014/0264871 A1* | 9/2014 | Lee | .......... | H01L 23/53238 |
| | | | | 257/751 |
| 2015/0140696 A1* | 5/2015 | Ahmed | .......... | H01L 21/22 |
| | | | | 438/17 |

* cited by examiner

VAPOR BASED SITE-ISOLATED PROCESSING SYSTEMS AND METHODS

CROSS-REFERENCE TO RELATED APPLICATIONS

This application claims priority to U.S. Provisional Patent Application No. 62/293,897, filed on Feb. 11, 2016, which is herein incorporated by reference for all purposes.

TECHNICAL FIELD

The present invention relates to vapor based site-isolated processing systems and methods. More particularly, this invention relates to processing systems and methods for vapor based processing in a site-isolated manner to enable combinatorial processing on a single substrate.

BACKGROUND

Combinatorial processing enables rapid evaluation of methods for semiconductor, solar, energy, or other device processing operations. The systems supporting the combinatorial processing need to be flexible and accommodate the demands for running the different processes either in parallel, serial, or some combination of the two.

Some exemplary processing operations include operations for adding (depositions) and removing layers (etch), defining features, preparing layers (e.g., cleans), doping, etc. Similar processing techniques apply to the manufacture of integrated circuit (IC) semiconductor devices, thin-film photovoltaic (TFPV) devices, flat panel displays, optoelectronics devices, data storage devices, magneto electronic devices, magneto optic devices, energy storage devices, packaged devices, wear resistant and other coatings, and the like. As feature sizes of IC semiconductor devices continue to shrink, improvements, whether in materials, unit processes, or process sequences, are continually being sought for the deposition processes. However, semiconductor and solar companies conduct research and development (R&D) on full wafer processing through the use of split lots, as the conventional deposition systems are designed to support this processing scheme. This approach has resulted in ever escalating R&D costs and the inability to conduct extensive experimentation in a timely and cost effective manner. Combinatorial processing as applied to semiconductor, solar, or energy manufacturing operations enables multiple experiments to be performed at one time in a high throughput manner. Equipment for performing the combinatorial processing and characterization must support the efficiency offered through the combinatorial processing operations.

However, current equipment used for combinatorial vapor based processing, such as atomic layer deposition (ALD), chemical vapor deposition (CVD), and plasma-enhanced chemical vapor deposition (PECVD), may not perform ideally due to processing fluids (e.g., gases) flowing from their intended site-isolated region of the substrate to another site-isolated region of the substrate. This may particularly be the case in systems which do not contact the surface of the substrate in order to form mechanical seals or barriers around the site-isolated regions, but, for example, direct a fluid (e.g., a gas) onto the substrate to form a barrier or "curtain." However, such "non-contact" systems are often preferred as they reduce particle and other contamination concerns.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Herein the term "fluid" may refer to a pure fluid (e.g. a pure gas such as argon) or mixed fluid such as a mixture of gasses (e.g., an inert gas such as argon and a reactive gas). When describing fluidic isolation or leaking from one fluid region to another, it is to be understood that this may involve isolation or leaking of primarily one or more of the reactive components of the fluid and not necessarily, or not to the same extent, the inert or other reactive components of the fluid. In addition the terms "flow" or "flowing" may refer to diffusion of only one or more components of the fluid (e.g., one or more of the reactive components of a mixed fluid) and not necessarily the entire fluid.

Embodiments described herein provide non-contact, site-isolated vapor based processing (e.g., atomic layer deposition (ALD), chemical vapor deposition (CVD), plasma-enhanced chemical vapor deposition (PECVD), etc.) systems and methods with minimal, if any, processing fluid leakage between the different site-isolated regions of the substrate (and/or the showerhead). In some embodiments, the system (and/or method) utilizes a showerhead with a plurality of injection ports formed on the bottom surface thereof. The injection ports (and/or the showerhead as a whole) are separated into multiple regions or sections by one or more isolation channels that include (one or more) exhaust ports formed therein. In some embodiments, during processing, processing fluids (e.g., gases) are delivered to the substrate through the injection ports and (at least in part) evacuated (e.g., using a vacuum supply) from the system through the exhaust ports in the isolation channel(s), perhaps along with an inert (or purge) gas introduced into the system elsewhere (e.g., below the substrate support). The processing fluids may also be evacuated by a vacuum that draws the processing fluids towards the periphery of the substrate (and/or the showerhead) in addition to the evacuation of the fluids through the exhaust ports in the isolation channel(s).

In some embodiments, the isolation channel(s) includes at least one isolation wall that extends from the bottom surface of the showerhead (i.e., to a height below that of the injection ports) and at least partially surrounds one of more of the sections of the injection ports, as well as separates each of the sections of injection ports from the other sections of injection ports. The exhaust ports of the isolation channel(s) may be formed within the isolation wall(s) (e.g., the exhaust ports may be formed in a trench formed between a first portion of the isolation wall that is adjacent to a first section of injection ports and a second portion of the isolation wall that is adjacent to a second portion of injection ports).

In some embodiments, the distance between a bottom edge (or end) of the isolation wall(s) is controlled, or at least maintained at a particular setting, during processing to tune the flow of processing fluids from the sections of the showerhead into the exhaust ports in the isolation channel(s). In some embodiments, this distance may be, for example, between 0.1 millimeters (mm) and 5 mm, such as about 0.5 mm.

The evacuation of the processing fluids through the exhaust ports in the isolation channel(s), and perhaps towards the periphery of the substrate, combined with the various geometries and dimensions of the system (e.g., the distance between the isolation wall(s) and the substrate, the height of the isolation wall(s), etc.), minimizes, if not completely eliminates, leakage of processing gas from one section of the showerhead (and/or one site-isolated region of the substrate) to the other sections of the showerhead (and/or the other site-isolated regions of the substrate). As a result, the efficiency of, for example, combinatorial processing is increased, thus improving yields and reducing testing and manufacturing costs.

Figure 1:
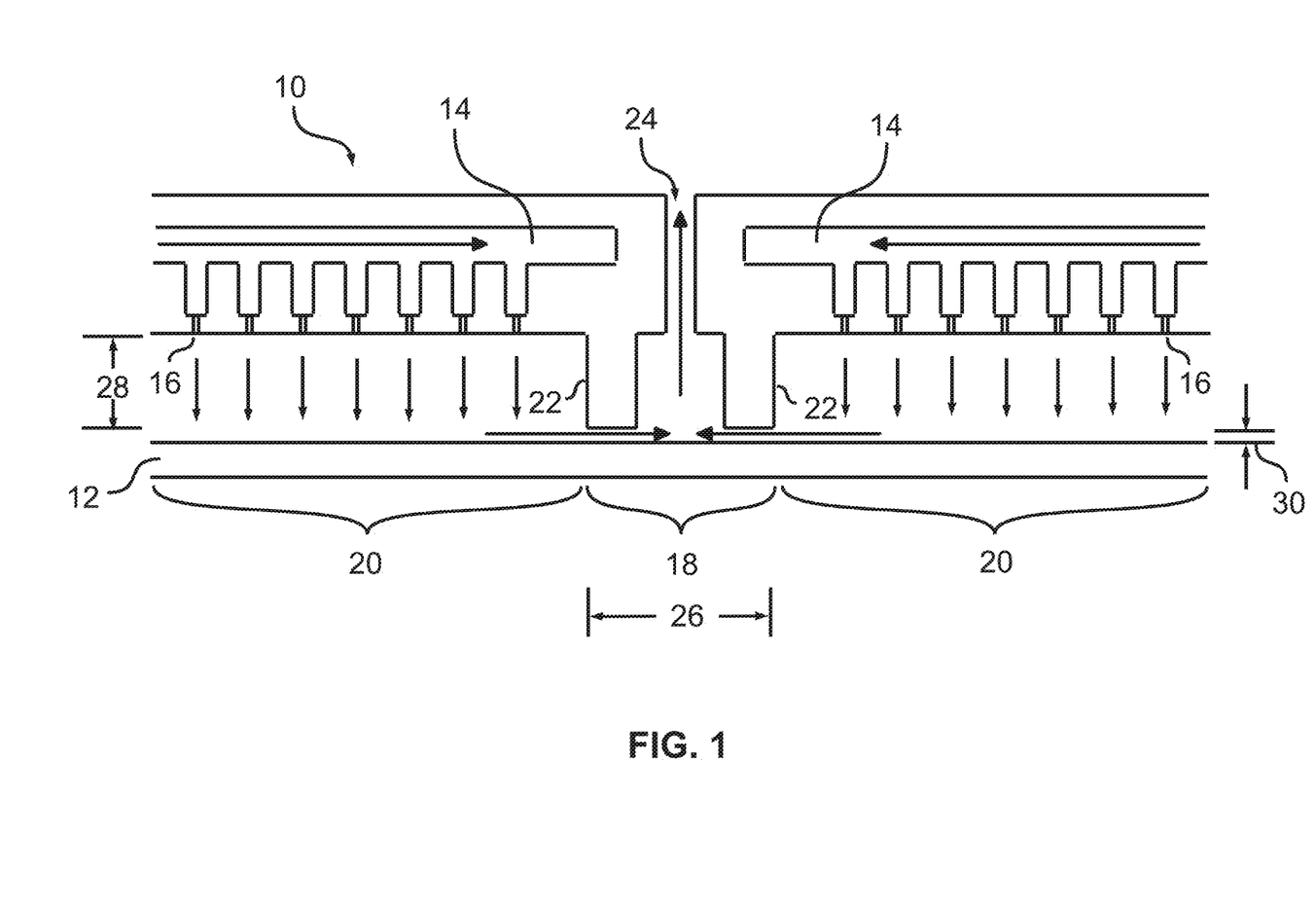
FIG. 1 is a simplified cross-sectional view of a substrate and a showerhead for vapor based processing systems according to some embodiments.

FIG. 1 is a simplified illustration a portion of a vapor based processing system (e.g., an ALD processing module) according to some embodiments. In particular, FIG. 1 is a simplified illustration of a showerhead 10, according to some embodiments, positioned above a substrate 12. In some embodiments, the substrate 12 is, for example, a semiconductor substrate (e.g., including silicon, germanium, gallium arsenide) or a transparent substrate (e.g., including glass) and has a width of, for example, about 200 millimeters (mm), 300 mm, or 400 mm. The showerhead 10 is positioned immediately above the substrate and may be formed from any known material suitable for the particular application and materials used, including stainless steel, aluminum, anodized aluminum, nickel, ceramics and the like. In some embodiments, both the showerhead 10 and the substrate 12 are substantially circular (or disk-shaped). It should be understood that what is shown in FIG. 1 may only correspond to the central or near-central portions of the showerhead 10 and the substrate 12.

Still referring to FIG. 1, the showerhead 10 includes a processing fluid channel (or channels) 14 formed therein as well as injection ports 16 formed on the bottom surface thereof, which are in fluid communication with the processing fluid channels 14. The showerhead 10 also includes an isolation channel (or portion) 18 at the central portion thereof that separates the injection ports 16 (and/or the processing channels 14 and/or the showerhead 10 as a whole) into sections 20. Each of the sections 20 of the showerhead 10 may correspond to a site-isolation region on the substrate 12.

The isolation channel 18 includes an isolation wall (or isolation wall portions) 22 extending from the bottom surface thereof (e.g., from the same "height" as the injection portions 16) and at least one exhaust port 24 extending through the isolation wall 22 and the portion of the showerhead 10 with the processing fluid channels 14. It should be noted that, at least within the showerhead 10, the exhaust port 24 is not in fluid communication with processing fluid channels 14. In some embodiments, the isolation wall 22 has a thickness (or width) 26 of, for example, between about 6 mm and 24 mm, such as about 17 mm. For example, each isolation wall portion 22 may have a thickness of about 6 mm and the gap between the isolation wall portions 22 (i.e., the exhaust port 24) may have a width of about 5 mm. In some embodiments, the isolation wall 22 has a height 28 of, for example, between about 5 mm and about 25 mm. Although not shown in FIG. 1, in some embodiments, the height of the showerhead 10 relative to the substrate 12 is monitored and controlled (e.g., the substrate 12 may be vertically moved relative to the showerhead 10) to maintain a specific distance (or gap) 30 between the isolation wall 22 (or more particularly, a lower end/edge thereof) and the substrate 12. The distance 30 may be, for example, between about 0.1 mm and about 5 mm, such as about 0.5 mm.

During operation, processing fluids (e.g., gases), such a precursors, reactants, etc., are delivered into the processing fluid channels 14 and flow onto the substrate 12 through the injection ports 16. At the same time, a vacuum (or partial pressure) is applied to the exhaust port 24 of the isolation channel 18 which causes fluids (e.g., the processing fluids and/or an insert/purge gas introduced into the system elsewhere) to be pulled toward the central portion of the substrate 12, flow between the isolation wall 22 and the substrate 12, and evacuated from the system through the exhaust port 24. In some embodiments, the vacuum is also applied to the periphery of the showerhead 10 and/or the substrate 12 such that some of the fluids are also drawn away from the center of the substrate 12.

In some embodiments, because of the geometries of the system (e.g., the width and height of the isolation wall 22, the distance between the isolation wall 22 and the substrate 12, etc.) combined with the flow rate of the processing fluids and the strength of the vacuum applied to the exhaust port, the amount of processing fluid that leaks from one section 20 of the showerhead 10 (and/or one site-isolated region of the substrate 12) to the other section 20 of the showerhead 10 (and/or a second site-isolated region of the substrate 12) is minimized, if not completely eliminated. More specifically, none, or substantially none, of the processing fluid that flows from the injection ports 16 in one section 20 of the showerhead 10 (e.g., the section 20 on the left in FIG. 1) onto the site-isolated region of the substrate 12 below that section 20 of the showerhead 10 is able to flow through the gap between the isolation wall 22 and the substrate 12 onto another site isolated region of the substrate 12 (e.g., the site-isolated region of the substrate 12 below the section 20 of the showerhead 10 on the right in FIG. 1). Rather, all, or substantially all, of the processing fluid, and perhaps some purge gas, that flows towards the isolation channel 18 is evacuated through the exhaust port 24 in the isolation channel 18 before reaching another site-isolated region of the substrate 12.

Figure 2:
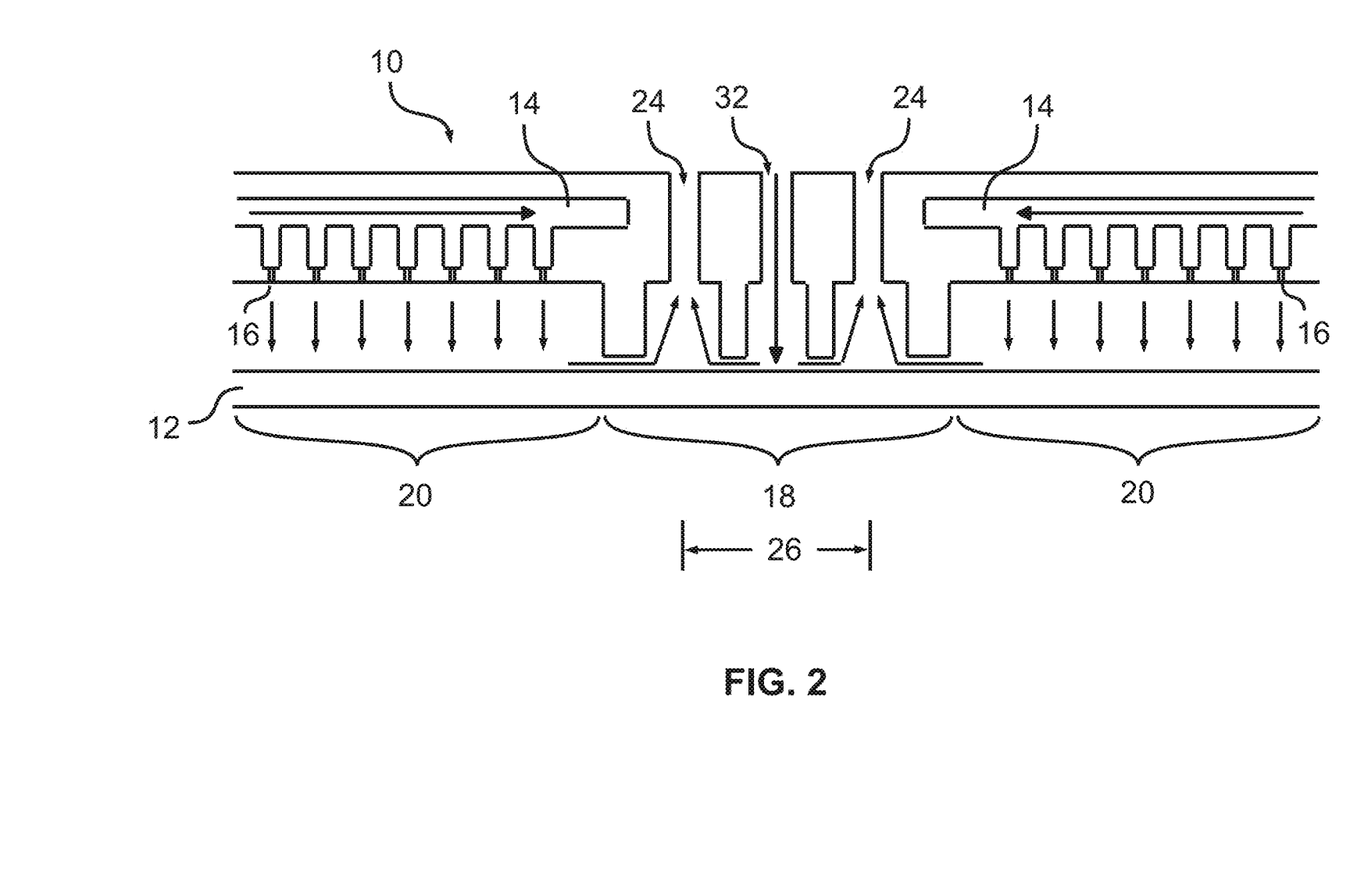
FIG. 2 is a simplified cross-sectional view of a substrate and a showerhead for vapor based processing systems according to some embodiments.

FIG. 2 is a simplified illustration of a showerhead 10, according to some embodiments, positioned over a substrate 12. The showerhead 10 shown in FIG. 2 may be similar in many respects to the one shown in FIG. 1. However, as shown in FIG. 2, the isolation channel 18 of the showerhead 10 includes two exhaust ports 24 as well as a purge port 32 between the exhaust ports 24. During operation, in addition to applying a vacuum to the exhaust ports 24, a purge gas (e.g., argon) is flowed through the purge port 32 onto the substrate 12. As shown, the purge gas is then evacuated from the system, along with the processing fluids (e.g., introduced via the processing fluid channels 14 and injection ports 16), through the exhaust ports 24. This addition of the purge gas flowed onto the substrate 12 through the purge port 32 may further enhance the separation of the processing fluids between the different sections 20 of the showerhead 10 and/or the site-isolated regions of the substrate 12.

Figure 3:
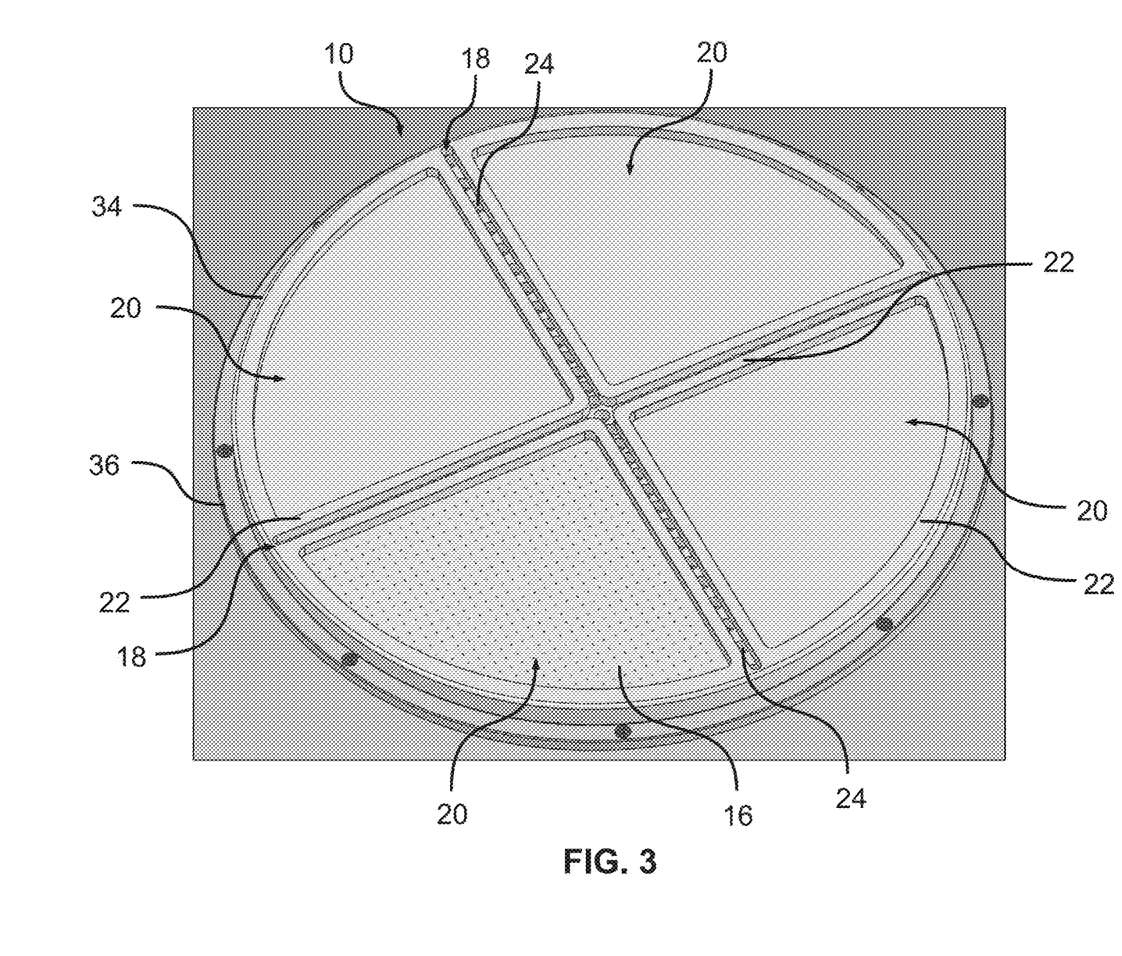
FIG. 3 is a perspective view of a showerhead for vapor based processing systems according to some embodiments.

FIG. 3 illustrates the lower surface of a showerhead 10 according to some embodiments. The showerhead 10 includes a bottom plate 34 and a top plate 36 (illustrated in more detail in FIG. 4). The bottom plate 34 (and/or the showerhead 10 as a whole) shown in FIG. 3 may correspond to/be similar to the showerhead 10 shown in FIG. 1, but includes four sections (i.e., quadrants) 20, each of which has a series of injections ports 16 formed therein (although the injection ports 16 are only shown as being formed in one of the sections 20 in FIG. 3). The sections 20 are separated, or defined, by the isolation wall(s) 22, which have exhaust ports 24 formed therein as described above. In some embodiments, the isolation wall(s) 22 also (at least partially) extends around the periphery of the showerhead 10 to form edge walls around each of the sections 20. The edge walls may have a thickness (or width) of, for example, between about 5 mm and about 15 mm, such as about 10 mm and a height similar to that of the other portions of the isolations wall(s) 22.

As referred to above, it should be understood that each of the sections 20 of the showerhead 10 may correspond to a site-isolated region defined on the substrate being processed. That is, processing fluids delivered to each of the sections 20 may flow through the respective injection ports 16 (i.e., the injection ports 16 within that section) to process a region on the substrate (e.g., having about the same size and shape as the respective section 20 of the showerhead 10) in a site-isolated manner. As such, the sections 20 of the showerhead 10 shown in FIG. 3 may also be considered to represent the site-isolated regions on the substrate. Thus, the showerhead 10 (and/or the vapor based processing system as a whole) is capable of processing different regions on the substrate in a site-isolated (and perhaps combinatorial) manner. For example, the different regions on the substrate may be simultaneously exposed to different processing fluids or gasses (e.g., different chemical compositions, vapor concentrations or durations, etc.).

It should be understood that in some embodiments the isolation channel(s) 18 divide the showerhead 10 into a different number (and size/shape) of portions (e.g., two, three, four, or more portions), thereby also defining a different number (and/or size/shape) of site-isolated regions on the substrate.

Figure 4:
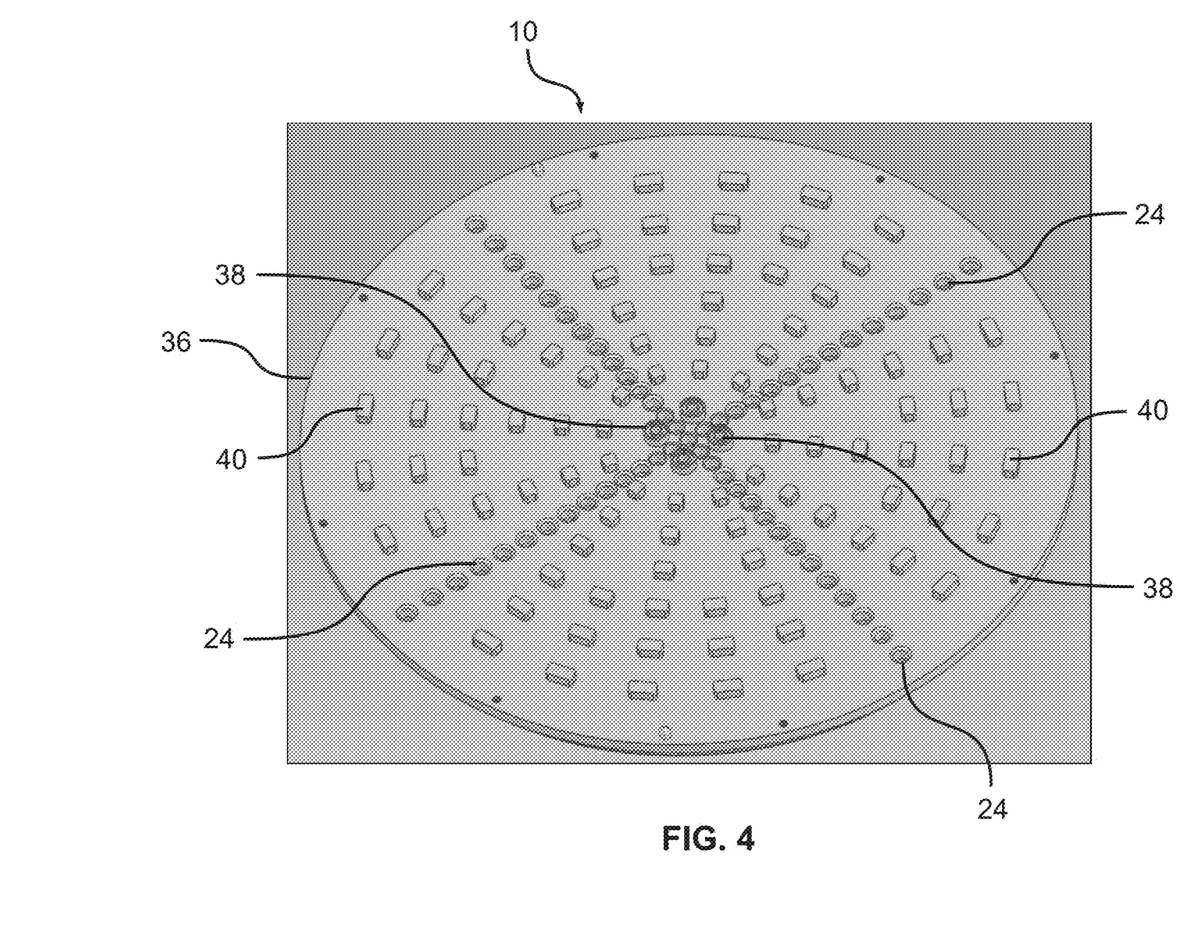
FIG. 4 is a perspective view of a top plate of the showerhead of FIG. 3.

FIG. 4 illustrates a lower surface of the top plate 36 of the showerhead 10 of FIG. 3. That is, FIG. 4 illustrates the surface of the top plate 36 that is adjacent to the bottom plate 34. As shown, the top plate 36 includes fluid inlets 38 and a series of protrusions 40 formed thereon. In some embodiments, each of the fluid inlets 38 corresponds to one of the sections 20 of the showerhead 10 (i.e., processing fluid delivered through the fluid inlets 38 flows from the injection ports 16 in a respective one of the sections 20 onto the site-isolated region of the substrate corresponding to that section 20). The protrusions 40 may contact the bottom plate 34 of the showerhead 10 and be used to maintain or define the processing fluid channels 14 shown in FIG. 1, which may be formed between the bottom plate 34 and the top plate 36. As is also shown in FIG. 4, the exhaust ports 24 also extend through the top plate 36 of the showerhead 10.

Figure 5:
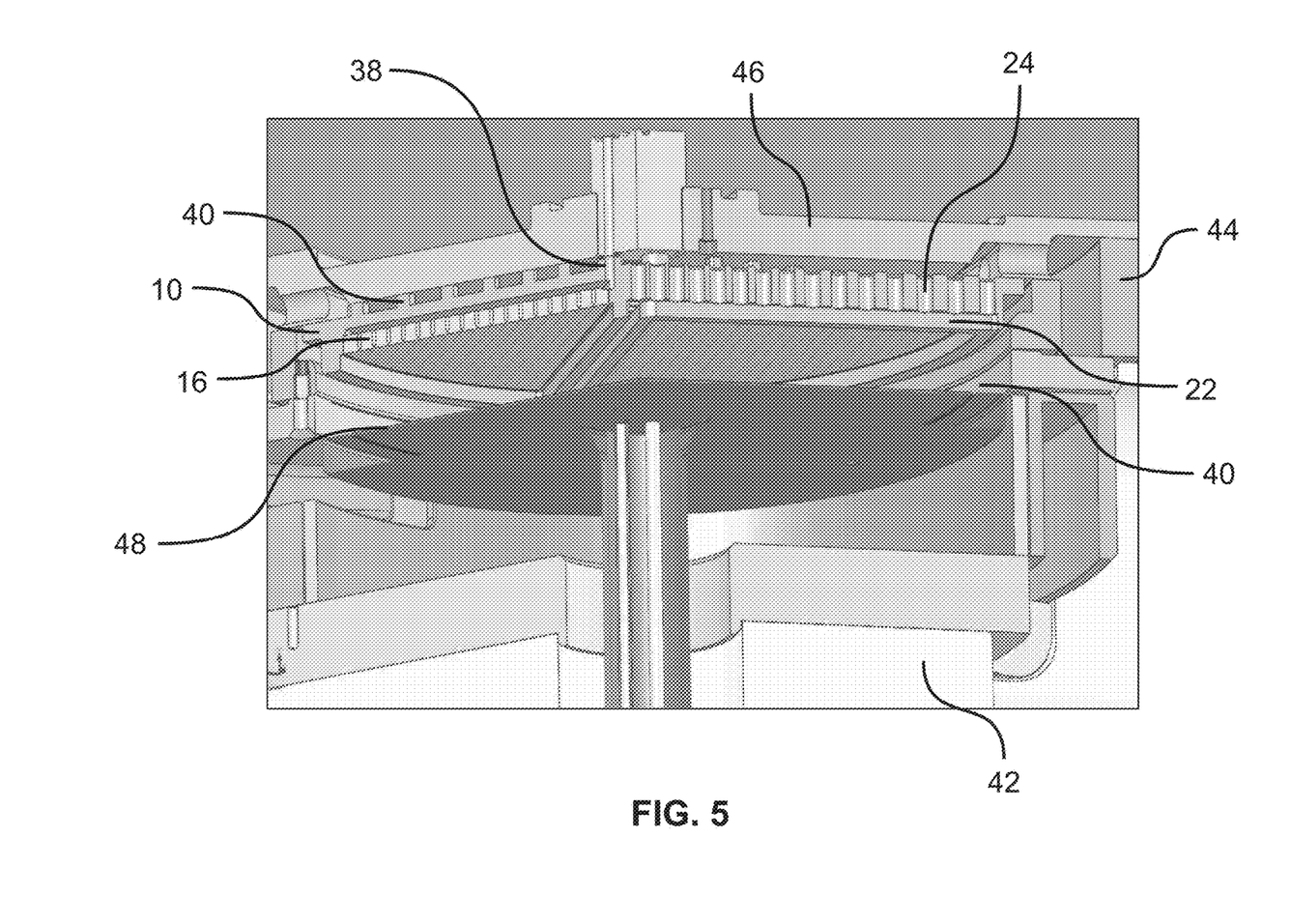
FIGS. 5-8 are sectional views of a vapor processing system according to some embodiments.
Figure 6:
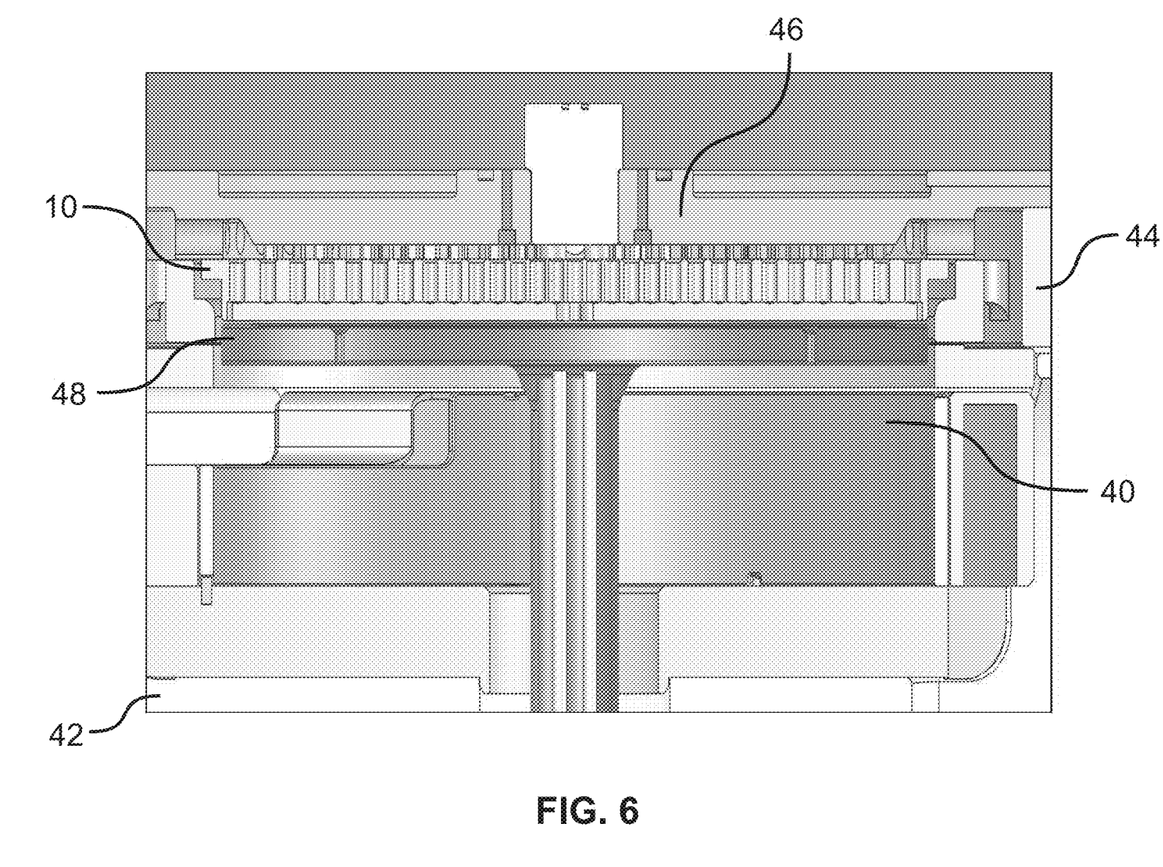
Figure 7:
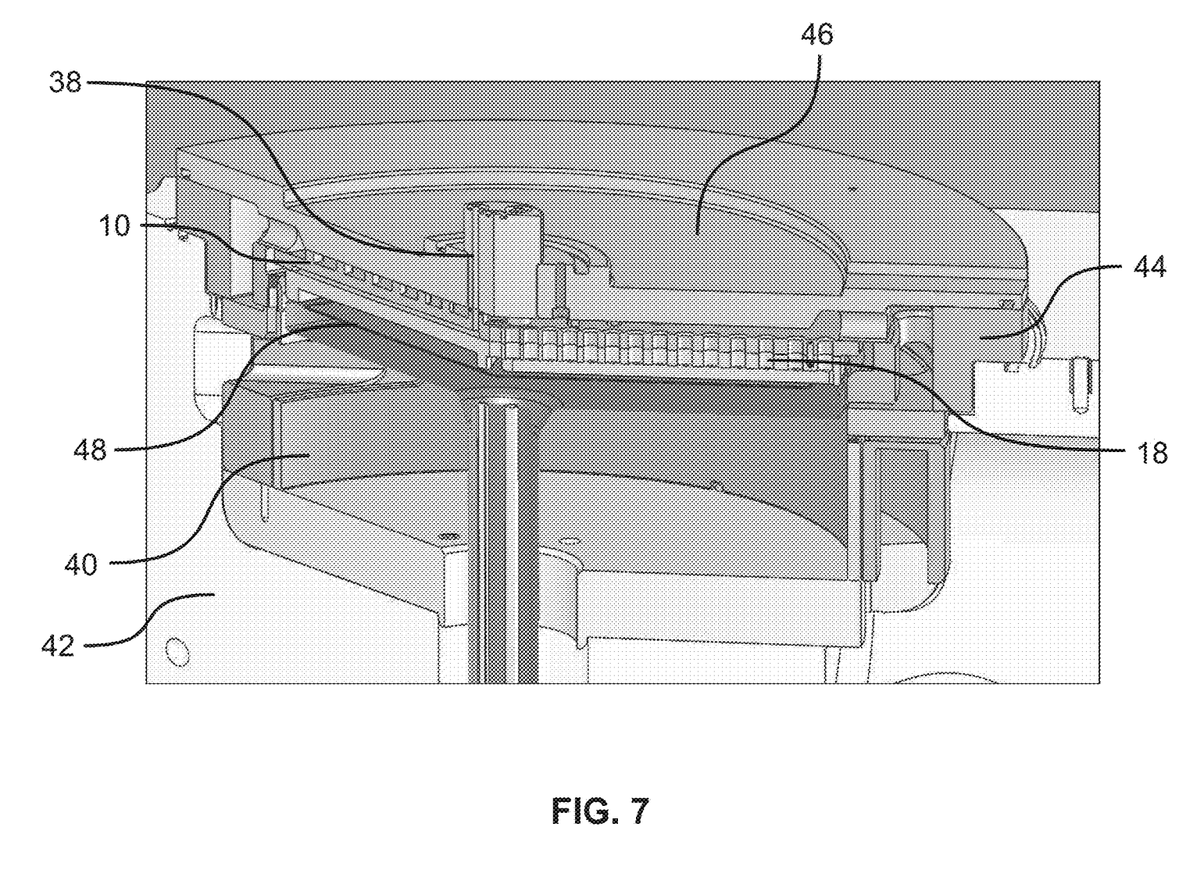

FIGS. 5-8 are sectioned views of a vapor based processing system (e.g., an ALD module or system) according to some embodiments, which includes the showerhead 10 described above with respect to FIGS. 3 and 4. As shown in FIGS. 5-7, the system (also) includes a processing chamber 40 formed by a base 42, a sidewall 44, and a lid 46. The showerhead 10 is disposed within the processing chamber 40 below the lid 46 and above a substrate support 48.

Figure 8:
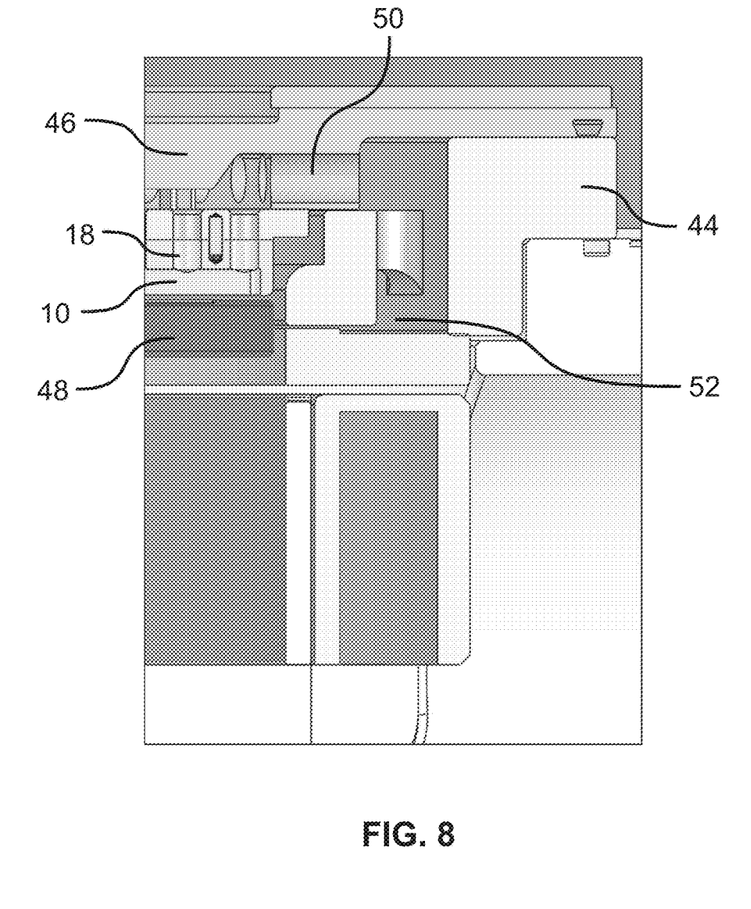

Referring specifically to FIG. 7, processing fluid is delivered into the showerhead 10 through the gas inlets 38, flows through the sections of the showerhead 10 and onto the substrate on the substrate support 48 through the injection ports (not shown in FIG. 7), and is evacuated through the isolation channels 18. Referring now to FIG. 8 in combination with FIG. 7, from the isolation channels 18, the processing fluid, as well as any evacuated purge gas, flows into a top exhaust 50 formed in the sidewall 44 where it is disposed of or recycled. In the depicted embodiment, a side exhaust 52 is also formed in the sidewall 44. The vacuum may also be applied to the side exhaust 52, which may result in the gases also being drawn away from the center of the substrate and/or the showerhead 10, as described above. During processing, a purge gas (e.g., an inert gas, such as argon) may (also) be introduced into the processing chamber 40 through an opening in the base 42 and/or a channel in a member supporting the substrate support 48.

Various experiments and simulations have been performed to demonstrate the efficiency of the isolation, or gas separation, provided by the showerhead(s) and/or processing system(s) as a whole described herein. In one experiment, a mix of 75% argon and 25% trimethylaluminum (TMA) gas was flowed through one section of a showerhead similar to those described above, and 100% argon gas was flowed through an adjacent section of the showerhead, with a distance of 0.5 mm between the isolation wall and the substrate. Nearly ideal gas separation was achieved outside of the isolation channel at all distances from the center of the showerhead, except at distances that correspond to the edges of the showerhead and/or the substrate (e.g., 140 mm and 160 mm).

Figure 9:
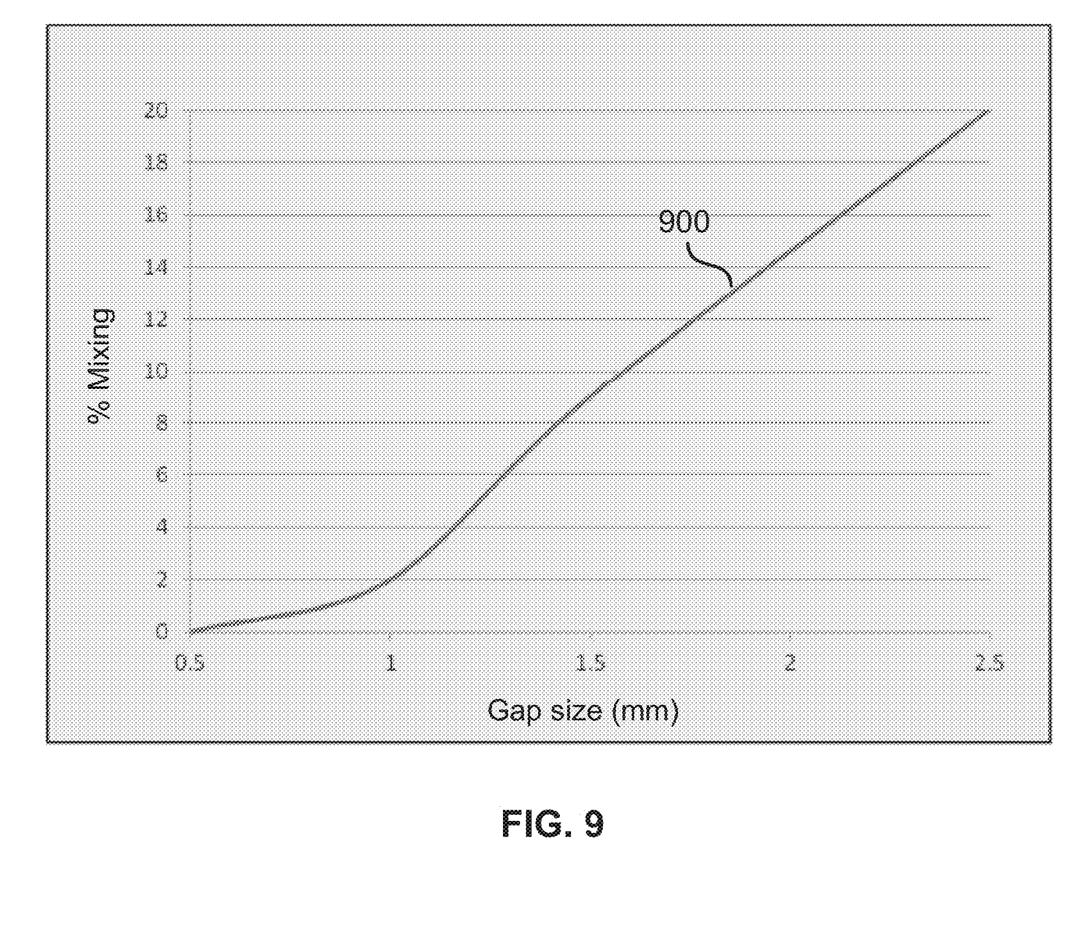
FIG. 9 is a graph showing data of an experiment testing the efficiency of the isolation, or gas separation, provided by showerheads and/or vapor base processing systems according to some embodiments.

As the size of the gap between the isolation wall and the substrate was increased (e.g., 1.0 mm, 1.5 mm, and 2.5 mm)

during additional experimentation, the efficiency of the gas separation decreased. Additionally, as the gap increased, the isolation channel exhaust flow increases and begins pulling part of the bottom purge gas into the sections of the showerhead. In particular, while no mixing was observed with a gap of 0.5 mm, as the gap was increased to 2.5 mm, the mixing increased to about 20% (@350 standard cubic centimeters per minute (sccm)/section), as shown by line 900 in FIG. 9. For this reason, it may be beneficial to balance, or reduce, the amount/flow of purge gas from the bottom of the processing chamber purge in combination with tuning the size of the gap between the isolation wall and the substrate.

Computational fluid dynamics (CFD) modeling, with argon and ozone as model gases and chamber geometry optimized for those gases, was also used to predict the efficiency of the gas separation. CFD modeling predicts less than 3% mixing within 3 mm and less than 1% within 5 mm of the boundary region (i.e., the isolation channel). Further, spectroscopic ellipsometry further verified the improved gas separation and/or site-isolation achieved using the inverted-interleaved pumping system described herein compared to traditional site-isolated processing systems using a barrier gas.

Figure 10:
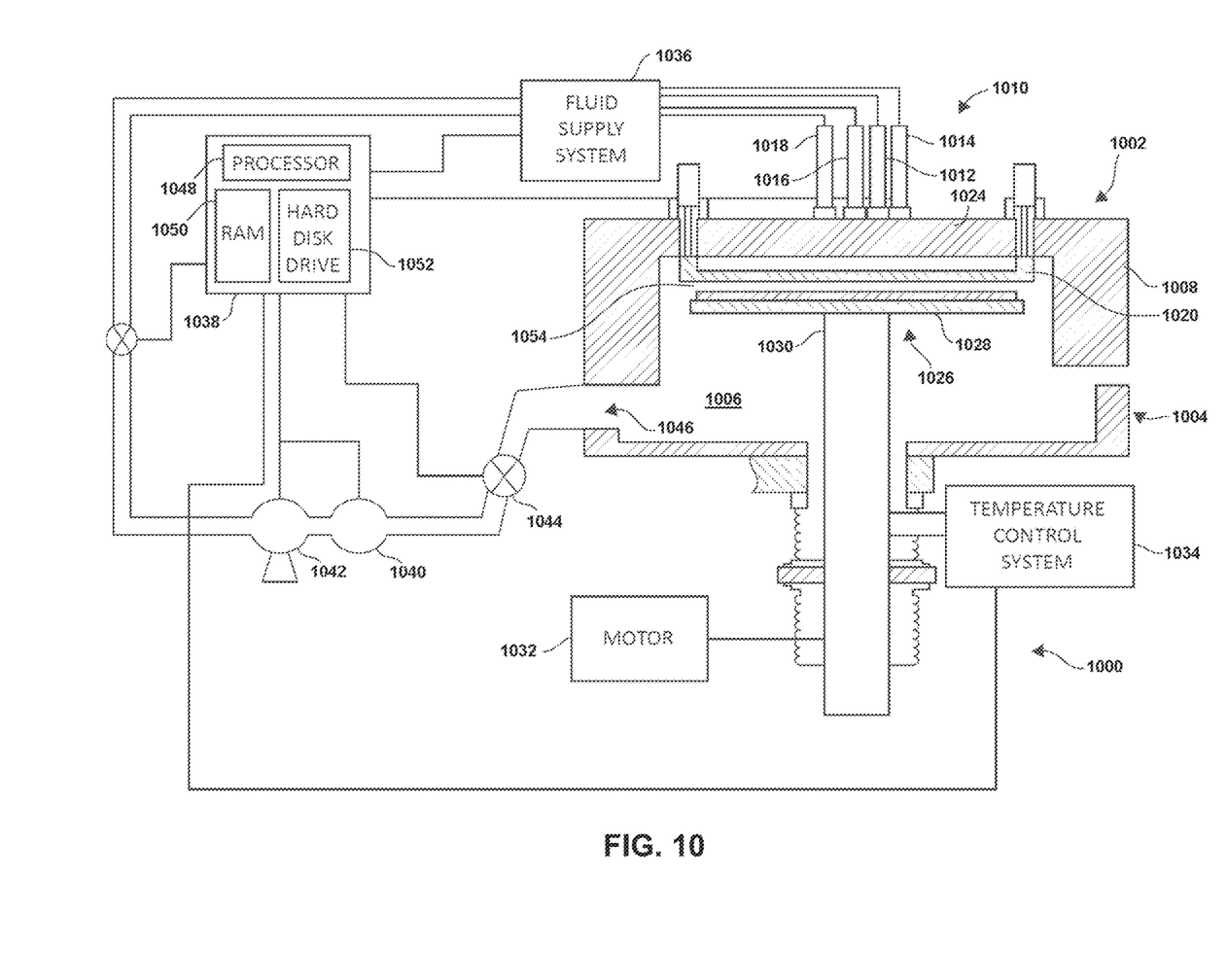
FIG. 10 is a simplified cross-sectional schematic of a vapor based processing system according to some embodiments.

FIG. 10 is a simplified cross-sectional schematic of a vapor based processing system 1000 (e.g., an ALD or CVD module or system) according to some embodiments. Although not specifically shown in FIG. 10, it should be understood that the system 1000 may utilize the showerhead 10, as well as the other features of the vapor based processing systems, described above.

The system 1000 includes an enclosure assembly 1002 formed from a process-compatible material, such as aluminum or anodized aluminum. The enclosure assembly 1002 includes a housing 1004, which defines a processing chamber 1006, and a vacuum lid assembly 1008 covering an opening to the processing chamber 1006 at an upper end thereof. Although only shown in cross-section, it should be understood that the processing chamber 1006 is enclosed on all sides by the housing 1004 and/or the vacuum lid assembly 1008.

A fluid conduit assembly 1010 is mounted to the vacuum lid assembly 408 and includes a plurality of fluid conduit branches (or fluid inlets) 1012, 1014, 1016, and 1018 and a showerhead 1020 to deliver processing fluids (e.g., precursors, reactants, and carrier fluids) into the processing chamber 1006. The showerhead 1020 (i.e., which may be similar to the showerheads described above) may be moveably coupled to an upper portion of the vacuum lid assembly 1008 (i.e., a backing plate 1024). The showerhead 1020 may be formed from any known material suitable for the application, including stainless steel, aluminum, anodized aluminum, nickel, ceramics and the like. In some embodiments, the showerhead 1020 may be considered a component separate from the fluid conduit assembly.

The system 1000 also includes a heater/lift assembly 1026 disposed within processing chamber 1006. The heater/lift assembly 1026 includes a support pedestal (or substrate support) 1028 connected to an upper portion of a support shaft 1030. The support pedestal 1028 is positioned between shaft 1030 and the backing plate 1024 and may be formed from any process-compatible material, including aluminum nitride and aluminum oxide. The support pedestal 1028 is configured to hold or support a substrate and may be a vacuum chuck, as is commonly understood, or utilize other conventional techniques, such as an electrostatic chuck (ESC) or physical clamping mechanisms, to prevent the substrate from moving on the support pedestal 1028. The support shaft 1030 is moveably coupled to the housing 1004 so as to vary the distance between support pedestal 1028 and the backing plate 1024. That is, the support shaft 1030 may be vertically moved to vary the distance between the support pedestal 1028 and the backing plate 1024. In the depicted embodiment, a lower portion of the support shaft 1030 is coupled to a motor 1032 which is configured to perform this movement. Although not shown, a sensor may provide information concerning the position of the support pedestal 1028 within processing chamber 1006.

The support pedestal 1028 may be used to heat the substrate through the use of heating elements (not shown) such as resistive heating elements embedded in the pedestal assembly. In the embodiment shown in FIG. 10, a temperature control system 1034 is provided to control the heating elements, as well as maintain the chamber housing 1004, vacuum lid assembly 1008, and showerhead 1020 within desired temperature ranges in a conventional manner.

Still referring to FIG. 10, the system 1000 also includes a fluid supply system 1036 and a controller (or system control system) 1038. The fluid supply system 1036 is in fluid communication with the fluid conduit branches 1012, 1014, 1016, and 1018 through a sequence of fluid conduits (or fluid lines).

The fluid supply system 1036 (and/or the controller 1038) controls the flow of processing fluids to, from, and within the processing chamber 1006 with a pressure control system that includes, in the embodiment shown, a turbo pump 1040 and a roughing pump 1042. The turbo pump 1040 and the roughing pump 1042 are in fluid communication with processing chamber 1006 via a butterfly valve 1044 and a pump channel 1046. Although not shown, the fluid supply system 1036 may include a plurality of processing fluid supplies (or sources) which include various processing fluids, such as reagents (e.g., precursors (or sources) and/or reactants (or oxidants)) for performing ALD (or CVD) processing, as is commonly understood. In some embodiments, the fluid supply system 1036 (and/or the system 1000 as a whole) also includes one or more vacuum lines (e.g., coupled to a "house vacuum" as is commonly understood) and/or pumps (for applying vacuums and/or partial pressures). Further, the fluid supply system 1036 (and/or the fluid conduit assembly 1010) may includes various components for controlling the flow of processing fluids, such as valves, mass flow controllers (MFCs), etc.

The controller 1038 includes a processor 1048 and memory, such as random access memory (RAM) 1050 and a hard disk drive 1052. The controller 1038 is in operable communication with the various other components of the system 1000, including the turbo pump 1040, the temperature control system 1034, the fluid supply system 1036, and the motor 1032 and controls the operation of the entire processing module to perform the methods and processes described herein.

During operation, the system 1000 establishes conditions in a processing region 1054 between an upper surface of the substrate and the showerhead 1020, such as injecting precursors (or reagents), as well as purge gases, to form the desired material on the surface of the substrate. In particular, in some embodiments, the fluid supply system 1036 provides various processing fluids (e.g., precursors, reactants, etc.) to the showerhead 1020, from which the fluids flow onto the substrate to, for example, form a layer of material on the substrate (e.g., via ALD), utilizing, for example, the methods described above.

Thus, in some embodiments, methods for processing a substrate are provided. A substrate is provided. A showerhead is positioned above the substrate. The showerhead includes a plurality of injection ports, at least one isolation channel, and at least one exhaust port on a bottom surface thereof. The at least one isolation channel separates the plurality of injection ports into two or more sections. The at least one exhaust port is positioned within the at least one isolation channel. The plurality of injection ports may not be in fluid communication with the at least one exhaust port within the showerhead. At least one processing fluid is caused to be delivered from the plurality of injection ports onto the substrate. At least some of the at least one processing fluid is caused to be removed from the substrate through the at least one exhaust port.

The at least one isolation channel may include an isolation wall extending from the bottom surface of the showerhead. A distance between a lower end of the isolation wall and the substrate may be less than a distance between the plurality of injection ports and the substrate.

The causing of the at least one processing fluid to be removed from the substrate through the at least one exhaust port may include applying a vacuum or a partial pressure to the at least one exhaust port. The isolation wall may at least partially extend around at least one of the two or more sections of injection ports.

The showerhead may further include at least one processing fluid channel formed therein. Each of the at least one processing fluid channels may be in fluid communication with the injection ports of a respective one of the two or more sections of injection ports. The causing of the at least one processing fluid to be delivered from the plurality of injection ports onto the substrate may include delivering the at least one processing fluid to the at least one processing fluid channel. Each of the at least one processing fluid channel may not be in fluid communication with the others of the at least one processing fluid channel within the showerhead.

The causing of the at least one processing fluid to be delivered from the plurality of injection ports onto the substrate may include delivering a first processing fluid to a first of the at least one processing fluid channel within the showerhead and delivering a second processing fluid to a second of the at least one processing fluid channel within the showerhead. The second processing fluid may differ from the first processing fluid with respect to at least one of chemical composition, vapor concentration, or a combination thereof.

At least some of the at least one processing fluid may be caused to flow towards a periphery of the substrate. The showerhead may further include a purge port on the bottom surface thereof, the purge port being positioned between two of the two or more sections of injection ports, and further comprising causing an inert gas to be delivered from the purge port onto the substrate. The distance between the lower end of the isolation wall and the substrate may be between about 0.1 mm and about 5 mm.

In some embodiments, methods for processing a substrate are provided. A substrate is provided. A showerhead is positioned above the substrate. The showerhead includes a plurality of processing fluid channels extending therethrough and a plurality of injection ports, at least one isolation channel, and at least one exhaust port on a bottom surface thereof. The at least one isolation channel separates the plurality of injection ports into a plurality of sections. The injection ports of each of the plurality of sections of injection ports is in fluid communication with a respective one of the processing fluid channels. The at least one exhaust port is positioned within the at least one isolation channel. The plurality of injection ports may not be in fluid communication with the at least one exhaust port within the showerhead. A processing fluid is delivered to each of the plurality of processing fluid channels such that the processing fluid flows through the plurality of injection ports and onto the substrate. A vacuum or a partial pressure is applied to the at least one exhaust port such that at least some of the processing fluid is removed from the substrate through the at least one exhaust port.

The at least one isolation channel may include an isolation wall extending from the bottom surface of the showerhead. A distance between a lower end of the isolation wall and the substrate may be less than a distance between the plurality of injection ports and the substrate. The isolation wall may at least partially extend around at least one of the plurality of sections of injection ports.

Each of the plurality of processing fluid channels may not in fluid communication with the others of the plurality of processing fluid channels within the showerhead.

The delivering of the processing fluid to each of the plurality of processing fluid channels may include delivering a first processing fluid to a first of the plurality of processing fluid channels within the showerhead and delivering a second processing fluid to a second of the plurality of processing fluid channels within the showerhead. The second processing fluid may differ from the first processing fluid with respect to at least one of chemical composition, vapor concentration, or a combination thereof.

In some embodiments, vapor based substrate processing systems are provided. A substrate support is configured to support a substrate. A showerhead is positioned above the substrate support. The showerhead includes a plurality of injection ports, at least one isolation channel, and at least one exhaust port on a bottom surface thereof. The at least one isolation channel separates the plurality of injection ports into two or more sections. The at least one exhaust port is positioned within the at least one isolation channel. The plurality of injection ports may not be in fluid communication with the at least one exhaust port within the showerhead. A processing fluid supply is configured to deliver at least one processing fluid to the showerhead such that the at least one processing fluid flows from the plurality of injection ports onto the substrate. A pump is in fluid communication with the at least one exhaust port and configured to apply a vacuum or a partial pressure to the at least one exhaust port such that at least some of the at least one processing fluid is removed from the substrate through the at least one exhaust port.

The at least one isolation channel may include an isolation wall extending from the bottom surface of the showerhead. A distance between a lower end of the isolation wall and the substrate may be less than a distance between the plurality of injection ports and the substrate.

The showerhead may further include at least one processing fluid channel formed therein. Each of the at least one processing fluid channel may be in fluid communication with the injection ports of a respective one of the two or more sections of injection ports. The processing fluid supply may be in fluid communication with the at least one processing fluid channel. Each of the at least one processing fluid channel may not be in fluid communication with the others of the at least one processing fluid channel within the showerhead.

The processing fluid supply may be configured to deliver a first processing fluid to a first of the at least one processing fluid channel within the showerhead and deliver a second processing fluid to a second of the at least one processing fluid channel within the showerhead. The second processing fluid may differ from the first processing fluid with respect to at least one of chemical composition, vapor concentration, or a combination thereof.

In some embodiments, the substrate may be rotated through means of rotating the substrate pedestal or through other means either continuously during the process or stepwise at certain regular or irregular points during the process.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for processing a substrate, the method comprising:
   providing a substrate;
   positioning a showerhead above the substrate, wherein the showerhead comprises a plurality of injection ports, at least one isolation channel, and at least one exhaust port on a bottom surface thereof, wherein the at least one isolation channel separates the plurality of injection ports into two or more sections, wherein at least one of the two or more sections is a planar surface including a plurality of injection ports disposed in an array along a first axis and a second axis of the planar surface, the at least one exhaust port is positioned within the at least one isolation channel, and the plurality of injection ports are not in fluid communication with the at least one exhaust port within the showerhead;
   causing at least one processing fluid to be delivered from the plurality of injection ports onto the substrate;
   causing at least some of the at least one processing fluid to be removed from the substrate through the at least one exhaust port;
   wherein the at least one isolation channel comprises an isolation wall extending from the bottom surface of the showerhead, and wherein a distance between a lower end of the isolation wall and the substrate is less than a distance between the plurality of injection ports and the substrate; and
   wherein the showerhead further comprises at least one processing fluid channel formed therein, each of the at least one processing fluid channels being in fluid communication with the injection ports of a respective one of the two or more sections of injection ports, and wherein the causing of the at least one processing fluid to be delivered from the plurality of injection ports onto the substrate comprising delivering the at least one processing fluid to the at least one processing fluid channel.

2. The method of claim 1, wherein the causing of the at least one processing fluid to be removed from the substrate through the at least one exhaust port comprises applying a vacuum or a partial pressure to the at least one exhaust port.

3. The method of claim 1, wherein the isolation wall at least partially extends around at least one of the two or more sections of injection ports.

4. The method of claim 1, wherein each of the at least one processing fluid channel is not in fluid communication with the others of the at least one processing fluid channel within the showerhead.

5. The method of claim 4, wherein the causing of the at least one processing fluid to be delivered from the plurality of injection ports onto the substrate comprises:
   delivering a first processing fluid to a first of the at least one processing fluid channel within the showerhead, and
   delivering a second processing fluid to a second of the at least one processing fluid channel within the showerhead,
   wherein the second processing fluid differs from the first processing fluid with respect to at least one of chemical composition, vapor concentration, or a combination thereof.

6. The method of claim 1, further comprising causing at least some of the at least one processing fluid to flow towards a periphery of the substrate.

7. The method of claim 1, wherein the showerhead further comprises a purge port on the bottom surface thereof, the purge port being positioned between two of the two or more sections of injection ports, and further comprising causing an inert gas to be delivered from the purge port onto the substrate.

8. The method of claim 1, wherein the distance between the lower end of the isolation wall and the substrate is between about 0.1 millimeters (mm) and about 5 mm.

9. A method for processing a substrate, the method comprising:
   providing a substrate;
   positioning a showerhead above the substrate, wherein the showerhead comprises a plurality of processing fluid channels extending therethrough and a plurality of injection ports, at least one isolation channel, and at least one exhaust port on a bottom surface thereof, wherein the at least one isolation channel separates the plurality of injection ports into a plurality of sections, wherein at least one of the plurality of sections is a planar surface including a plurality of injection ports disposed in an array along a first axis and a second axis of the planar surface, the injection ports of each of the plurality of sections of injection ports is in fluid communication with a respective one of the processing fluid channels, the at least one exhaust port is positioned within the at least one isolation channel, and the plurality of injection ports are not in fluid communication with the at least one exhaust port within the showerhead;
   delivering a processing fluid to each of the plurality of processing fluid channels such that the processing fluid flows through the plurality of injection ports and onto the substrate;
   applying a vacuum or a partial pressure to the at least one exhaust port such that at least some of the processing fluid is removed from the substrate through the at least one exhaust port;
   wherein the at least one isolation channel comprises an isolation wall extending from the bottom surface of the showerhead, and wherein a distance between a lower end of the isolation wall and the substrate is less than a distance between the plurality of injection ports and the substrate; and
   wherein the isolation wall at least partially extends around at least one of the plurality of sections of injection ports.

10. The method of claim 9, wherein each of the plurality of processing fluid channels is not in fluid communication with the others of the plurality of processing fluid channels within the showerhead.

11. The method of claim 10, wherein the delivering of the processing fluid to each of the plurality of processing fluid channels comprises:

delivering a first processing fluid to a first of the plurality of processing fluid channels within the showerhead, and delivering a second processing fluid to a second of the plurality of processing fluid channels within the showerhead, wherein the second processing fluid differs from the first processing fluid with respect to at least one of chemical composition, vapor concentration, or a combination thereof.

* * * * *